United States Patent [19]
Kizuki

[11] Patent Number: 6,096,617
[45] Date of Patent: Aug. 1, 2000

[54] METHOD OF MANUFACTURING A CARBON-DOPED COMPOUND SEMICONDUCTOR LAYER

[75] Inventor: Hirotaka Kizuki, Tokyo, Japan

[73] Assignee: Mitsubishi Denki Kabushiki Kaisha, Tokyo, Japan

[21] Appl. No.: 08/685,061

[22] Filed: Jul. 22, 1996

[30] Foreign Application Priority Data

Nov. 14, 1995 [JP] Japan .................................. 7-295509
Jan. 17, 1996 [JP] Japan .................................. 8-005714

[51] Int. Cl.$^7$ .................................................. H01L 21/331
[52] U.S. Cl. .......................................... 438/312; 438/925
[58] Field of Search .................................. 437/129, 133, 437/107, 112; 438/312, 313, 315, 316, 925

[56] References Cited

U.S. PATENT DOCUMENTS

| | | | |
|---|---|---|---|
| 5,244,829 | 9/1993 | Kim ........................................ | 437/104 |
| 5,385,864 | 1/1995 | Kawasaki et al. ....................... | 437/129 |
| 5,491,106 | 2/1996 | Seki et al. ............................... | 437/129 |
| 5,498,568 | 3/1996 | Hosoba et al. .......................... | 437/129 |

FOREIGN PATENT DOCUMENTS

| | | |
|---|---|---|
| 2-203520 | 8/1990 | Japan . |
| 2-273917 | 11/1990 | Japan . |
| 3-235323 | 10/1991 | Japan . |
| 5-190467 | 7/1993 | Japan . |
| 5-198588 | 8/1993 | Japan . |

OTHER PUBLICATIONS

"Effect of post–growth cooling ambient on acceptor passivation in carbon in carbon–doped GaAs grown by metalorganic chemical vapor deposition", Stockman et al., Appl. Phys. Lett., vol. 62, No. 11, Mar. 15, 1993, pp. 1248–1250.

R. B. Bylsma, et al: "Carbon–doped Impurity Induced Layer Disorder 0.98 pm Lasers", *The Journal of Applied Physics*, 76, Jul. 1, 1994, pp. 590–592.

Noriyuki WATANABE, et al: "Carbon Doping in GaAs Using Trimethylarsine by Metaloganic Chemical Vapor Deposition with High–Speed Rotating Susceptor", *The Journal of Crystal Growth*, 147, 1995, pp. 256–263.

Hiroshi Fushimi, et al: "The Presence of Isolated Hydrogen Donors in Heavily Carbon–Doped GaAs", *The Journal of Crystal Growth*, 145, 1994, pp. 420–426.

The 42nd Applied Physics Association Lecture Meeting (1995), 1226.

Hiroki Kohda, et al: "A New Model for Carbon Doping in GaAs —Effect of the Methyl Radical", *The Journal of Crystal Growth*, 135, 1994, pp. 629–632.

*Primary Examiner*—Kevin M. Picardat
*Attorney, Agent, or Firm*—McDermott, Will & Emery

[57] ABSTRACT

A compound semiconductor device is manufactured by forming a carbon-doped compound semiconductor device at a predetermined growth temperature on a compound semiconductor substrate, stopping the growth and changing the growth temperature of the compound semiconductor layer, including the carbon-doped compound semiconductor layer, to a predetermined temperature under an atmosphere comprising an alkylarsine, thereby avoiding the formation of free atomic hydrogen and preventing hydrogen contamination of the C-doped compound semiconductor layer. As a result, the amount of coupling between hydrogen and carbon in the carbon-doped compound semiconductor layer is significantly reduced, thereby preventing lowering of the carbon carrier concentration. The present method enables formation of a C-doped GaAs base layer without deterioration of electrical characteristics, and formation of a laser having a second clad layer of C-doped compound semiconductor layer with improved reliability.

12 Claims, 11 Drawing Sheets

| | | SUBSTRATE TEMPERATURE | ATMOSPHERE |
|---|---|---|---|
| (1) | MOUNTING SUBSTRATE IN FURNACE | ROOM TEMPERATURE | |
| (2) | SUBSTRATE TEMP. RISE | ROOM TEMP. ⟶ 200°C<br>200°C<br>200°C ⟶ 700°C | H2<br>INTRODUCTION OF AsH$_3$<br>HYDROGEN + AsH$_3$ |
| (3) | FORMING GaAs BUFFER LAYER | 700°C | HYDROGEN + AsH$_3$ + TMGa |
| (4) | FORMING n⁺-GaAs COLLECTOR CONTACT LAYER | 700°C | HYDROGEN + AsH$_3$ + TMGa + Si$_2$H$_6$ |
| (5) | FORMING n-GaAs COLLECTOR LAYER | 700°C | HYDROGEN + AsH$_3$ + TMGa + Si$_2$H$_6$<br>REDUCTION IN Si$_2$H$_6$ FLOW RATE |
| (6) | STOPPING GROWTH | 700°C ⟶ 590°C | HYDROGEN + AsH$_3$ |
| (7) | FORMING P⁺-GaAs BASE LAYER | 590°C | HYDROGEN + TMGa + TMAs |
| (8) | STOPPING GROWTH | 590°C ⟶ 700°C | HYDROGEN + TMAs |
| (9) | FORMING n-AlGaAs EMITTER LAYER | 700°C | HYDROGEN + AsH$_3$ + TMGa + TMA1 + Si$_2$H$_6$ |
| (10) | FORMING n⁺-InGaAs EMITTER CONTACT LAYER | 700°C | HYDROGEN + AsH$_3$ + TMGa + TMIn + Si$_2$H$_6$ |
| (11) | COOLING SUBSTRATE | 700°C ⟶ 300°C<br>300°C ⟶ ROOM TEMP. | HYDROGEN + TMAs<br>HYDROGEN |

FIG. 4

METHOD OF MANUFACTURING A CARBON-DOPED COMPOUND SEMICONDUCTOR LAYER

TECHNICAL FIELD

The present invention relates to a method of manufacturing a compound semiconductor device, particularly a semiconductor device comprising a carbon-doped compound semiconductor layer, wherein lowering of carrier concentration after growth is prevented.

BACKGROUND ART

Recently, an HBT (Heterojunction Bipolar Transistor) has been aggressively researched and developed as an electronic device for the next generation to be incorporated in high output amplifiers for use in satellite communication due to its high speed characteristics and high current driving force. However, sufficient reliability has not yet been achieved for high output. One of the causes for insufficient reliability is a deterioration of the electrical characteristics in a p-type base layer doped with impurities of high concentration. For example, an HBT of npn-type comprises an n-GaAs collector layer, a p-GaAs base layer, and an n-AlGaAs emitter layer. Be is conventionally employed for doping the p-GaAs base layer by MBE (Molecular Beam Epitaxy). Conventional practices also comprise the use of materials, such as DEZ (diethylzinc) to form the p-GaAs base layer by MOCVD (Metalorganic Chemical Vapor Deposition), for doping the p-GaAs base layer with Zn.

It has been found, however, that Zn and Be are easily diffused in GaAs to such an extent that Zn and Be are diffused in the entire n-AlGaAs emitter layer during formation of the emitter layer or during testing after assembling the device, whereby the concentration of impurities is lowered in the emitter layer, eventually resulting in reduction of the collector current. To overcome such a drawback, carbon has recently become the focus of attention as a p-type dopant, because it is not readily diffused. Accordingly, the concept of a carbon (C)-doped GaAs base layer has arisen for improving the reliability of an HBT.

For example, the Journal of Crystal Growth 135 (1994) 629–632, H. Kohda et al. discusses the possibility of doping GaAs with carbon of high concentration employing trimethylarsenic (TMAs) and trimethylgallium (TMGa) in a MOCVD method.

Japanese Laid-Open Patent Publication (unexamined) No.203520/1990 discloses a method of growing a C-doped GaAs layer, employing TMAs and TMGa as raw materials, by heating a GaAs substrate to 650° C. under an atmosphere of AsH$_3$, stabilizing the pressure, introducing TMAs in addition to AsH$_3$, and further introducing TMGa.

Japanese Laid-Open Patent Publication (unexamined) No. 190467/1993 discloses a method of growing an AlGaAs layer having a carbon additive amount of not less than $4 \times 10^{19}$ cm$^{-3}$ by establishing a substrate temperature of 450° C. to 550° C., employing a supply ratio of raw material gas TMAs/(TMGa+TMAl) of not more than 3, and growing at atmospheric pressure.

As for a semiconductor device different from an HBT, the Journal of Applied Physics (76), Jul. 1, 1994 590–592, R. B. Bylsma et al. reported a trial production of a C-doped InGaAs/AlGaAs laser.

There are several methods of growing C-doped GaAs. According to the report in the Journal of Crystal Growth 147 (1995) 256–263, N. Watanabe et al., GaAs growth during MOCVD has been researched in detail, and growth of GaAs doped with highly concentrated C may be easily achieved by employing TMAs as a Group-V raw material, employing TMGa as a Group-III raw material, and optimizing the growth conditions. The resulting p-GaAs layer is obtained by controlling the introduction of C from the raw materials TMAs and TMGa instead of employing an independent dopant. It is, however, reported that, even when forming an HBT having a p-GaAs base layer doped with C, there is a deterioration of the device characteristics due to hydrogen contamination, whereby hydrogen combines with the highly concentrated C dopant in GaAs.

For example, the Journal of Crystal Growth 145 (1994) 420–426, H. Fushimi et al. discusses the activation of holes by annealing, after acknowledging systematic inactivation of holes due to hydrogen concentration of high concentration C-doped GaAs. H. Fushimi et al. showed that the hydrogen contamination of C-doped GaAs layer brings about carbon inactivation.

Furthermore, in the preparatory printed speeches for the 42nd Applied Physics Association Lecture Meeting (1995) 1226, it was reported that hydrogen inactivation of carbon results in deterioration of the characteristics of a p-n junction diode.

Thus, the reliability of an HBT cannot be improved simply by adopting a C-doped GaAs base layer, because carbon is inactivated due to hydrogen contamination of the C-doped GaAs layer. Accordingly, there exists a recognized need to prevent such hydrogen contamination at the time of forming the C-doped GaAs layer.

Conventional MOCVD methods for the formation of an HET comprises:

(1) mounting a semi-insulating GaAs substrate on a wafer susceptor in a MOCVD furnace, increasing the temperature of the GaAs substrate under an atmosphere of arsine (AsH$_3$), forming a predetermined GaAs layer when required, introducing TMGa serving as a Group-III raw material in addition to arsine and disilane (Si$_2$H$_6$) as an n-type dopant at a prescribed flow rate at a predetermined temperature, thereby forming an n-GaAs collector layer;

(2) stopping the introduction of TMGa as a Group-III raw material and disilane as an n-type dopant, and changing a temperature of the wafer susceptor to a predetermined temperature under an atmosphere of arsine;

(3) introducing TMGa as a Group-III raw material and TMAs as a Group-V raw material at a prescribed flow rate when reaching the predetermined temperature, thereby forming a p-GaAs base layer doped with a high concentration C-doped p-GaAs base layer on the n-GaAs collector layer;

(4) supplying arsine simultaneously with stopping the introduction of TMGa and TMAs, and changing the temperature of wafer susceptor to a predetermined temperature under the atmosphere of arsine;

(5) introducing TMGa and TMAl as Group-III raw materials and disilane as an n-type dopant material at a prescribed flow rate when reaching the predetermined temperature, thereby forming an n-AlGaAs emitter layer on the mentioned n-AlGa base layer; and (6) cooling the resulting semiconductor layer to a predetermined temperature in an atmosphere of arsine, after forming a prescribed GaAs contact layer when required.

In the conventional HBT p-GaAs base layer doped with highly concentrated carbon formed as described above, the semiconductor layer is both formed and cooled in an atmosphere of arsine. During such forming and cooling, atomic hydrogen from arsine is taken up in the p-GaAs base layer thereby inactivating carbon, eventually causing deterioration of the characteristics of a p-n junction diode.

DISCLOSURE OF THE INVENTION

An object of the present invention is a method of manufacturing a compound semiconductor device, wherein a C-doped compound semiconductor layer does not undergo a reduction in carrier concentration after growth or when the temperature is changed during manufacturing.

Another object of the invention is a method of manufacturing a compound semiconductor device, wherein a compound semiconductor layer, having an optimum growth temperature different from that of a C-doped compound semiconductor layer, is formed on the C-doped compound semiconductor layer while preventing the C-doped compound semiconductor layer already formed from undergoing a reduction in carrier concentration.

A further object of the invention is a method of manufacturing a compound semiconductor device, wherein a C-doped compound semiconductor layer is formed, a compound semiconductor layer having an optimum growth temperature different from that of the C-doped semiconductor layer, is stacked on the C-doped semiconductor layer, and the resulting wafer is removed from the manufacturing apparatus without lowering the carrier concentration of the C-doped semiconductor.

A further object of the invention is a method of manufacturing an HBT in which C-doped p-type base layer does not undergo a reduction carrier concentration and, hence, the p-n junction diode characteristics are not deteriorated.

A still further object of the invention is a method of efficiently manufacturing a highly reliable laser having a second clad layer comprised of a C-doped p-type compound semiconductor layer.

According to the present invention, the foregoing and other objects are accomplished in the following manner. One aspect of the present invention comprises a method of manufacturing a compound semiconductor device, which method comprises: forming a C-doped compound semiconductor layer on a compound semiconductor substrate at a predetermined first temperature for growth; and stopping the growth and changing the first temperature of C-doped compound semiconductor layer to a predetermined second temperature; wherein said both stopping growth and changing temperature are carried out under an atmosphere of an alkylarsine. It was found that, advantageously, no free atomic hydrogen is produced during such processing in an atmosphere comprising an alkylarsine. As a result, hydrogen contamination of the C-doped compound semiconductor layer is prevented and, hence, hydrogen does not combine with the carbon of the C-doped compound semiconductor layer. Thus, the present invention advantageously prevents a reduction in the carbon activation rate and, hence, prevents lowering of the carrier concentration.

Another aspect of the present invention comprises a method of manufacturing a compound semiconductor device, which method comprises: forming a first C-doped compound semiconductor layer of first conduction type on a compound semiconductor substrate at a first growth temperature; changing the first growth temperature to a second growth temperature of a second compound semiconductor layer; and forming the second compound semiconductor layer on said first compound semiconductor layer at the second growth temperature in a raw material gas for forming the second compound semiconductor layer; wherein the first growth temperature is changed to the second growth temperature in an atmosphere comprising an alkylarsine. As a result, the present invention enables the temperature of the second compound semiconductor device to be set at an optimum growth temperature, while preventing the C-doped compound semiconductor layer from hydrogen contamination, whereby a compound semiconductor layer other than the C-doped compound semiconductor layer may be efficiently formed without lowering the carrier concentration of the C-doped compound semiconductor layer.

A further aspect of the present invention comprises a method of manufacturing a compound semiconductor device, which method comprises: a first C-doped compound semiconductor layer of first conduction type on a compound semiconductor substrate at a first growth temperature; changing the first growth temperature to a second growth temperature of a second compound semiconductor layer under an atmosphere of an alkylarsine; forming the second compound semiconductor layer on said first compound semiconductor layer at the second growth temperature in a raw material gas for forming the second compound semiconductor layer; and cooling, in an atmosphere comprising an alkyllarsine, said first and second compound semiconductor layers already formed to a predetermined temperature. As a result, the present invention enables cooling a wafer without lowering the carrier concentration of the C-doped first compound semiconductor layer so that the wafer may be freely removed from a processing apparatus, thereby affording increased flexibility in selecting manufacturing steps and equipment for efficiently forming highly reliable semiconductor devices.

Yet a further aspect of the invention comprises a method of manufacturing a compound semiconductor device, which method comprises: forming a collector layer of an n-type first compound semiconductor on a semi-insulating compound semiconductor substrate, and forming a base layer of a p-type first compound semiconductor doped with carbon at a first growth temperature; changing said first growth temperature to a second growth temperature, in an atmosphere comprising an alkylarsine, after completing the formation of said base layer; and forming an emitter layer of an n-type second compound semiconductor on the base layer in a raw material gas for forming the emitter layer. No free atomic hydrogen is produced in such an atmosphere comprising an alkylarsine, thereby preventing the C-doped p-type base layer from hydrogen contamination. Accordingly, in accordance with this aspect of the invention, coupling of carbon of the C-doped compound semiconductor layer with hydrogen is reduced, thereby preventing reduction of the carbon serving as an impurity for producing a carrier. Consequently, an HBT is provided which does not suffer from reduced carrier concentration and, hence, exhibits less deterioration of the p-n junction diode. Thus, the present invention provides an HBT of high reliability.

A still further aspect of the present invention comprises a method of manufacturing a compound semiconductor device, which method comprises: forming a first clad layer of an n-type compound semiconductor layer, an active layer of compound semiconductor layer, and a second clad layer of a p-type compound semiconductor layer doped with carbon as an impurity at a first growth temperature on an n-type compound semiconductor substrate; changing said first growth temperature to a second growth temperature, after completing the formation of said second clad layer in an atmosphere comprising an alkylarsine; forming a cap layer of a p-type compound semiconductor layer on said second clad layer; and cooling each layer already formed to a predetermined temperature in an atmosphere comprising an alkylarsine. As a result, the present invention enables efficient manufacturing of a laser not only at a growth temperature suitable for the cap layer material, but also enabling cooling of the substrate and freely withdrawing it from the processing apparatus. Thus, the present invention provides a highly reliable laser with reduced diffusion of impurities into the active layer, while the p-type semiconductor layer does not suffer from reduced lowering carrier concentration. Thus, the present invention provides great flexibility in selecting manufacturing steps and apparatus.

Additional objects, features and advantages of the invention will become apparent in the course of the following description together with the accompanying drawings.

BRIEF DESCRIPTION OF DRAWINGS

FIG. 4 is a flow diagram of a method of manufacturing an HBT in accordance with the present invention.

BEST MODE FOR CARRYING OUT THE INVENTION

First Embodiment

Figure 1:
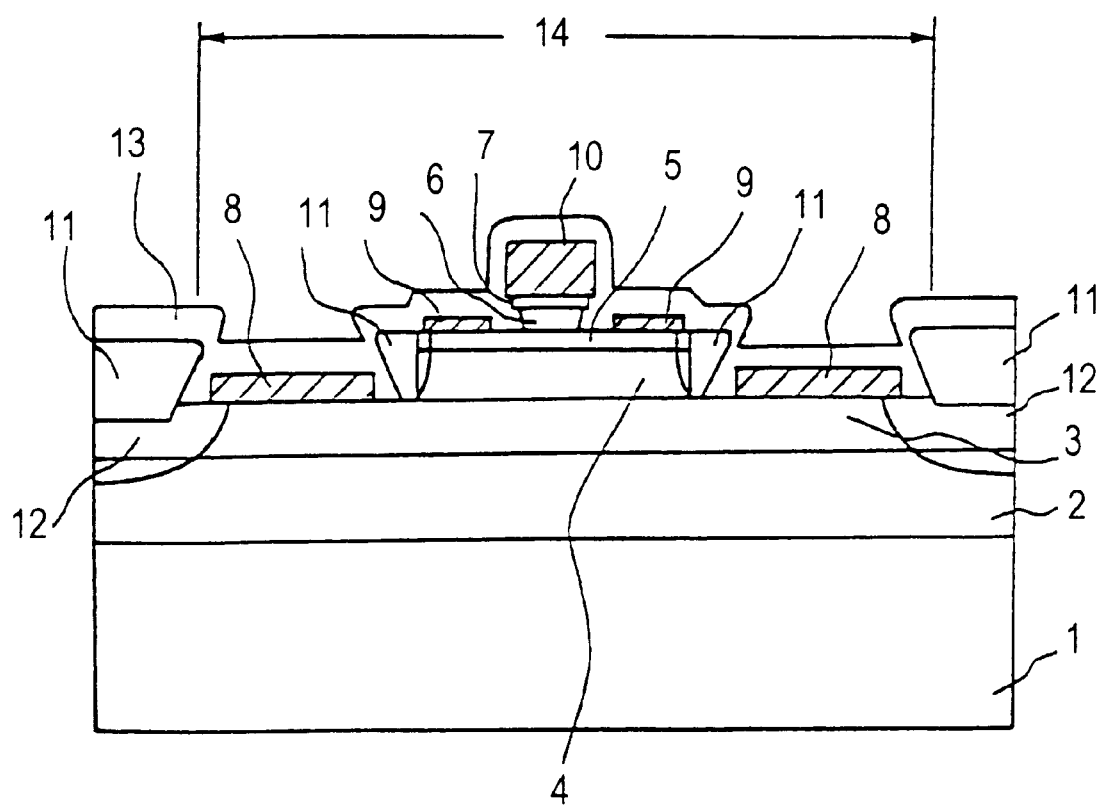
FIG. 1 is a sectional view of an HBT produced in accordance with the present invention.

FIG. 1 is a sectional view of a compound semiconductor device produced in accordance with a preferred embodiment of the present invention. In this embodiment, an HBT is formed by employing GaAs. As shown in FIG. 1, an i-GaAs buffer layer 2 is formed on a semi-insulating GaAs substrate serving as a compound semiconductor substrate 1. An n-GaAs collector contact layer 3, an n-GaAs collector layer 4, a p-GaAs base layer doped with carbon of high concentration and serving as a compound semiconductor layer or a first compound semiconductor layer 5, an n-AlGaAs emitter layer serving as a second compound semiconductor layer 6, and an n-InGaAs emitter contact layer 7 are sequentially formed on buffer layer 2. Reference numeral 8 designates collector electrodes, numeral 9 designates base electrodes, numeral 10 designates an emitter electrode, numeral 11 designates device isolating layers, numeral 12 designates device isolating regions, numeral 13 designates an insulating protective coat, and numeral 14 indicates a device region.

The collector contact layer 3 can have an impurity concentration n of about $5.0 \times 10^{18}$ cm$^{-3}$ and can have a thickness of about 5000 Å; the collector layer 4 can have an impurity concentration n of about $3.0 \times 10^{16}$ cm$^{-3}$ and can have a thickness of about 1000 Å; the base layer 5 can have an impurity concentration p of about $4 \times 10^{19}$ cm$^{-3}$ and can have a thickness of about 1500 Å; the emitter layer 6, of $Al_{0.26}Ga_{0.74}As$, can have an impurity concentration n of about $5.0 \times 10^{17}$ cm$^{-3}$ and can have a thickness of about 1500 Å; and the emitter contact layer 7, of $In_{0.5}Ga_{0.5}As$, can have an impurity concentration n of about $4 \times 10^{19}$ cm$^{-3}$ and can have a thickness of about 1000 Å.

Buffer layer 2 and collector contact layer 3 are sequentially stacked on a principal plane of semi-insulating GaAs substrate 1, and device isolating regions 12 are formed so that one device region 14 may be defined by buffer layer 2 and collector contact layer 3. Collector layer 4 and base layer 5 are sequentially stacked on the center of the surface of collector contact layer 3 defined by device isolating regions 12. Collector electrodes 8 are disposed on the surface of collector contact layer 3 with collector layer 4 therebetween. Device isolating layers 11 are disposed, facing each other with collector layer electrodes 8 therebetween, on the side of collector layer 4 and base layer 5 and on the surface of device isolating regions 12.

Emitter layer 6 and emitter contact layer 7 are sequentially stacked on the center of the surface of base layer 5; base electrodes 9 are disposed on the surface of base layer 5 with emitter layer 6 therebetween; and emitter electrode 10 is disposed on the surface of emitter contact layer 7. Insulating protective layer 13 is formed on the surface of device region 14, in which a device including the device isolating layers 11, is formed, so that collector electrodes 8, base electrodes 9 and emitter electrode 10 are partially exposed. The HBT depicted in FIG. 1 not only functions in essentially the same manner as a conventional bipolar transistor but, in addition, exhibits faster operation and superior high frequency characteristics.

Figure 2:
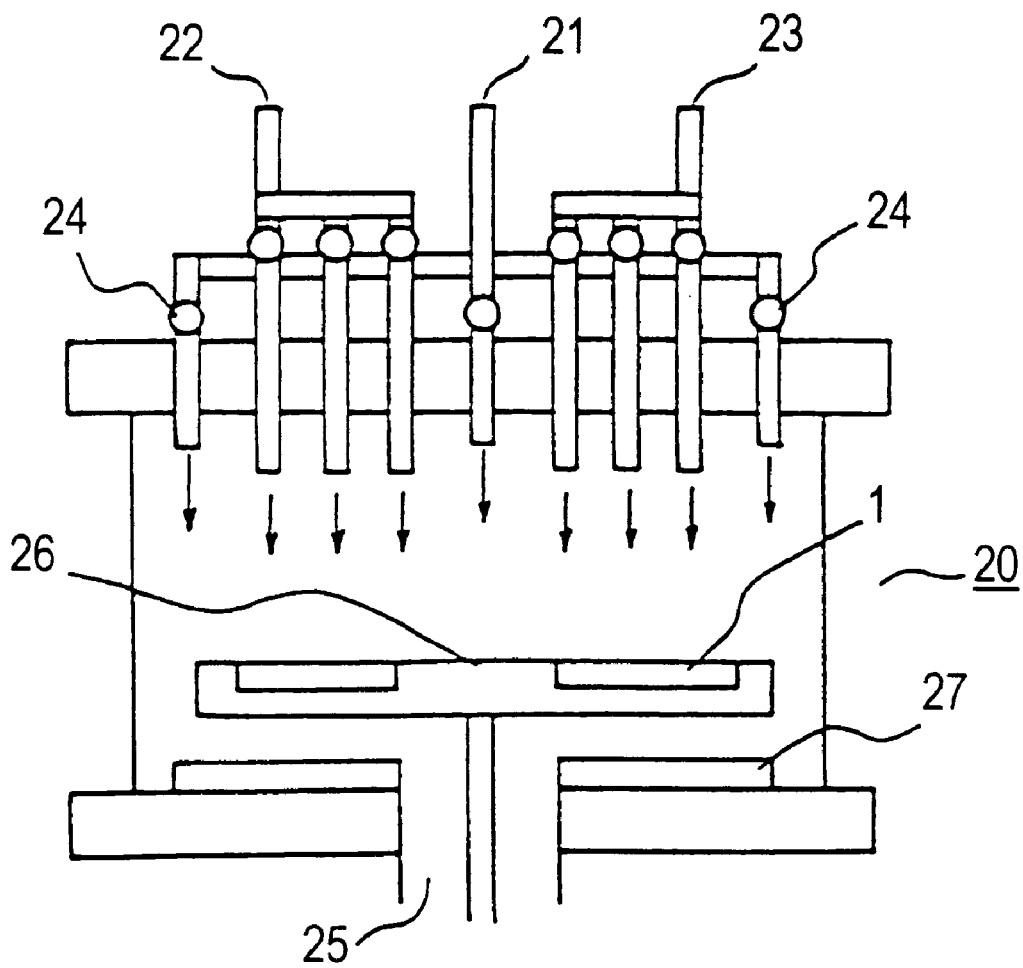
FIG. 2 is a sectional view of an apparatus used in MOCVD.

A preferred method of manufacturing an HBT in accordance with the present invention is hereinafter described. In FIG. 2, there is schematically depicted a sectional view of an MOCVD apparatus comprising reactor 20, $H_2$ gas inlet 21, and a Group-III raw material gas inlet 22 through which a gas, such as TMGa, TMAl, and TMIn, is supplied. Reference numeral 23 designates an inlet through which a Group-V raw material gas, such as $AsH_3$, TMAs, $Si_2H_6$ is supplied. Numeral 24 designates gas opening and closing valves by which the composition of inflow gas and flow rate thereof are controlled. Numeral 25 designates an exhaust port through which the gas involved in the reaction is sucked by a vacuum device (not illustrated) and exhausted as an exhaust gas.

A wafer susceptor 26 is rotatably supported inside reactor 20. Wafer susceptor 26 is preferably disk-shaped and a plurality of GaAs substrates 1 are mounted thereon. During the reaction, wafer susceptor 26 is rotated by a driving device (not illustrated) together with the rotary shaft so that an even and uniform reaction takes place on the substrates. A heater 27 is disposed under wafer susceptor 26 facing to the back side of wafer susceptor 26 for heating the compound semiconductor layer formed on GaAs substrates 1, as by radiation.

Figure 3:
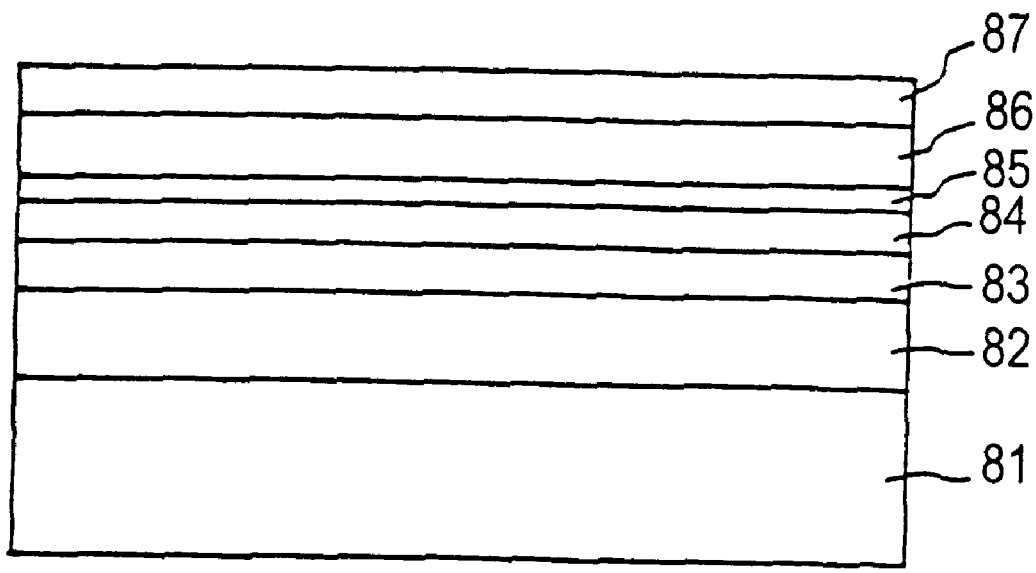
FIG. 3 is a sectional view of a wafer for an HBT formed in accordance with an embodiment of the present invention.

FIG. 3 is a sectional view of a wafer for an HBT employing GaAs in accordance with the present invention. In FIG. 3, reference numeral 81 designates a semi-insulating GaAs substrate, numeral 82 designates a buffer layer, numeral 83 designates a collection contact layer, numeral 84 denotes a collector layer, numeral 85 designates a base layer, numeral 86 denotes an emitter layer, and numeral 87 designates an emitter contact layer. The buffer layer 82, collector contact layer 83, collector layer 84, base layer 85, emitter layer 86 and emitter contact layer 87, are sequentially stacked in order on semi-insulating GaAs substrate 81.

FIG. 4 is a flow chart of a method of processing a wafer for an HBT in accordance with the present invention. Referring to FIG. 4, GaAs substrate 1 is mounted on wafer susceptor 26 in the reactor 20 shown in FIG. 2 (Step 1). The reactor 20 is then subject to a reduction in pressure. Thereafter, hydrogen is introduced in the reactor 20, and wafer susceptor 26 is heated by heater 27, whereby the temperature of the substrate is raised from room temperature to about 200° C. under an atmosphere of hydrogen. At the temperature of about 200° C., the Group-V raw material gas, e.g., $AsH_3$, is introduced and the temperature of the substrate is raised from about 200° C. to about 700° C. under an atmosphere of $AsH_3$ diluted with hydrogen (Step 2).

The Group-III raw material gas, e.g., TMGa, is introduced in the reactor at a temperature of about 700° C., and the GaAs buffer layer 2 is formed on the GaAs substrate 1 under an atmosphere of $AsH_3$ and TMGa diluted with hydrogen (Step 3).

Subsequently, the Group-V raw material gas, e.g., $Si_2H_6$, is introduced in reactor 20 at a temperature of about 700° C., and the $n^+$-GaAs collector contact layer 3 is formed on GaAs buffer layer 2 under an atmosphere of $AsH_3$, TMGa and $Si_2H_6$ diluted with hydrogen (Step 4). At the same temperature of about 700° C., the flow rate of $Si_2H_6$ is reduced, and the n-GaAs collector layer 4 is formed on the $n^+$-GaAs collector contact layer 3 under an atmosphere of $AsH_3$, TMGa and $Si_2H_6$ diluted with hydrogen (Step 5).

Thereafter, the introduction of TMGa and $Si_2H_6$ is stopped to suspend growth, and the temperature of the substrate is decreased from about 700° C. to about 590° C. under an atmosphere of $AsH_3$ diluted with hydrogen. In addition, cooling is performed by stopping the heater 27 (Step 6). Subsequently, while maintaining the substrate temperature at about 590° C., a Group-III raw material gas, TMGa, and TMAs, a Group-V raw material gas, are supplied establishing a supply ratio of a flow rate in moles of the Group-V raw material gas to a flow rate in moles of Group-III raw material gas (hereinafter referred to as V/III ratio) in the range of about 10 to about 20, and the C-doped $p^+$-GaAs base layer 5 is formed on the n-GaAs collector layer under an atmosphere of TMGa and TMAs diluted with hydrogen at a growth pressure of about 100 Torr (Step 7).

Thereafter, the growth of base layer 5 is stopped by introducing TMGa, and the substrate temperature is again raised by heating from about 590° C. to about 700° C. under an atmosphere of TMAs diluted with hydrogen (Step 8).

Subsequently, the n-AlGaAs emitter layer 6 is formed on the $p^+$-GaAs base layer 5 at a temperature of about 700° C. under an atmosphere of $AsH_3$, TMGa, TMAl and $Si_2H_6$ diluted with hydrogen (Step 9). Further, the $n^+$-InGaAs emitter contact layer 7 is formed on the n-AlGaAs emitter layer 6 at the same temperature of about 700° C. under an atmosphere of $AsH_3$, TMGa, TMIn and $Si_2H_6$ diluted with hydrogen (Step 10).

Thereafter, the supply of $AsH_3$, TMGa, TMIn and $Si_2H_6$ is stopped, TMAs is introduced to cool the substrate temperature from about 700° C. to about 300° C. under an atmosphere of TMAs diluted with hydrogen, and the supply of TMAs is stopped to cool the substrate temperature from about 300° C. to about room temperature under an atmosphere of hydrogen (Step 11). The cooling of the substrate in reactor 20 to about room temperature is performed for the purpose of withdrawing the wafer into the air and transferring it through the air to a manufacturing apparatus of a subsequent step, whereby the wafer is prevented from high temperature oxidation. Although a continuous manufacturing system under vacuum may be employed, it is preferred in the state of art to cool the wafer to about room temperature in reactor 20, thereafter to take it out into the air and to transfer it to a subsequent step through the air. Such a manufacturing system is economical, facilitates maintenance of manufacturing equipment, and increases flexibility in selecting manufacturing steps and apparatus.

Figure 5:
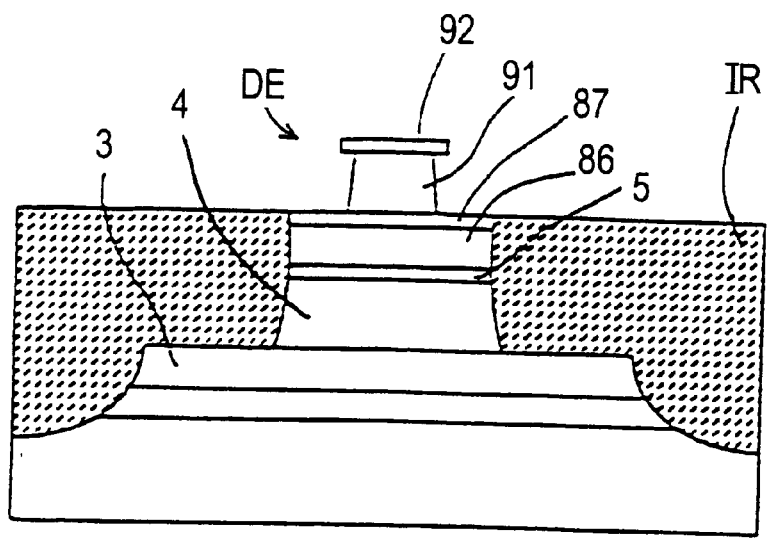
FIG. 5(a) is a sectional view of a device depicting one stage of a method of manufacturing an HBT in accordance with the present invention.
FIG. 5(b) is a sectional view of a device depicting another stage of a method of manufacturing an HBT in accordance with the present invention.
FIG. 5(c) is a sectional view of a device depicting another stage of a method of manufacturing an HBT in accordance with the present invention.
FIG. 5(d) is a sectional view of a device depicting another stage of a method of manufacturing an HBT in accordance with the present invention.
Figure 5:
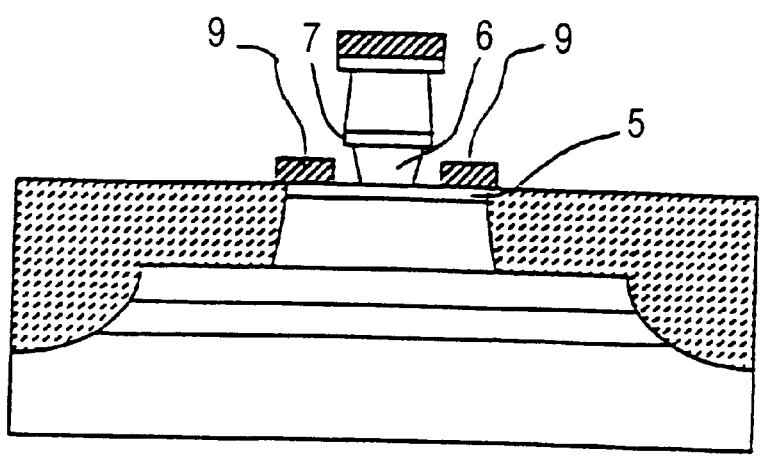
Figure 5:
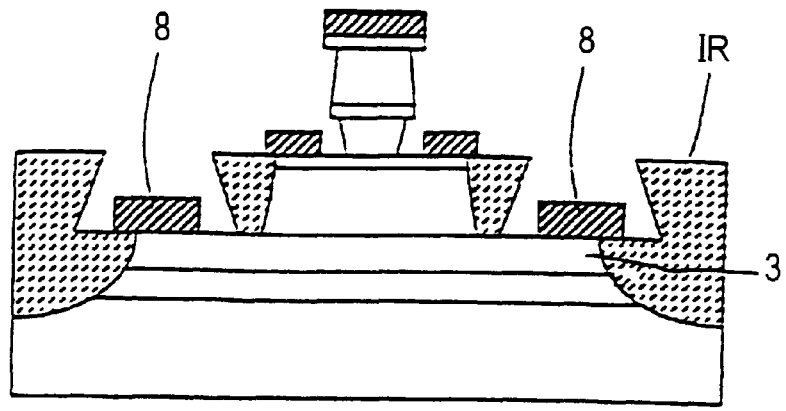
Figure 5:
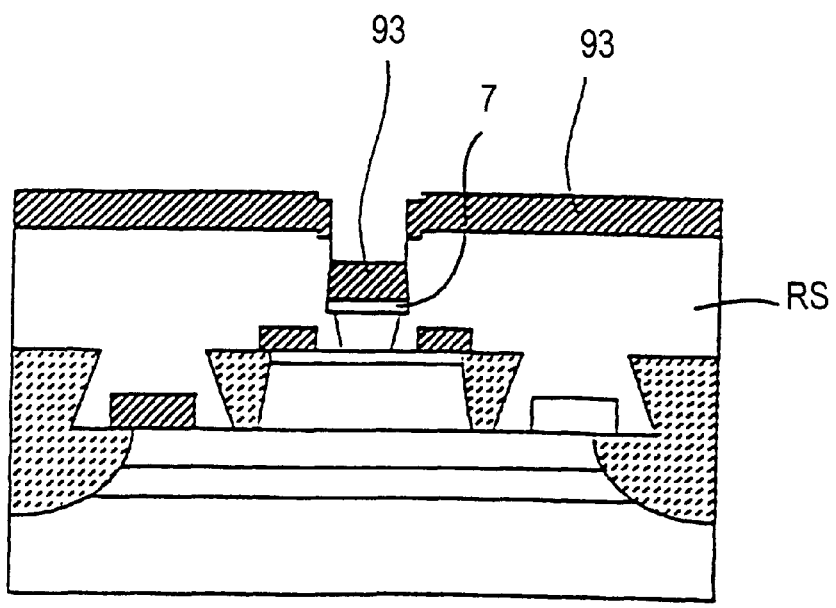

Formation of an HBT after forming the wafer is carried out generally in the following manner. FIGS. 5(a), (b), (c) and (d) are sectional views showing various stages of an HBT manufacturing process in accordance with an embodiment of the present invention. With reference to FIGS. 5(a) to (d), and FIGS. 1 and 3, ion implantation is performed from above the principal plane of emitter contact layer 87 of the wafer shown in FIG. 3, whereby an insulating region IR is selectively formed extending from the surface to within emitter contact layer 87 which, along with base layer 5, collector layer 4 and collector contact layer 3, integrally serving as a device, are respectively shaped. A SiON film 91 and WSi film 92 are sequentially formed on the principal plane of emitter contact layer 87. SiON film 91 and WSi film 92 are then selectively and partially removed, thereby forming a dummy emitter (DE) comprising SiON film 91 and WSi film 92 as shown in FIG. 5(a).

Using dummy emitter (DE) as a mask, emitter contact layer 87 and emitter layer 86 are selectively etched, forming emitter contact layer 7 and emitter layer 6, respectively, while the surface of base layer 5 is exposed. Base electrodes 9 are then selectively formed on the exposed surface of the base layer 5. FIG. 5(b) shows a sectional view of the device at the time of completing this step.

Thereafter, the insulating region IR is selectively etched to expose the surface of collector contact layer 3. Collector electrodes 8 are then selectively formed on the exposed collector contact layer 3. FIG. 5(c) show a sectional view of the device at the time of completing this step.

After removing the dummy emitter (DE), a resist (RS) is applied to the entire surface. The resist (RS) located on the upper part of the emitter contact layer 7 is then selectively removed, and a conductive material 93, such as metal, is formed on the entire surface. FIG. 5(d) shows a sectional view of the device at the time of completing this step.

The conductive material on the resist (RS) is then removed together with the resist (RS) leaving the conductive material on emitter contact layer 7. The conductive material 93 left on emitter contact layer 7 forms emitter electrode 10. Insulating protective layer 13 is then formed on the entire surface, thereby completing the basic arrangement of the HBT. FIG. 1 shows a sectional view of the HBT at the time of completing this step.

In manufacturing a wafer of HBT by MOCVD, AsH$_3$, diluted with hydrogen, is conventionally supplied as a Group-V raw material gas, including during stopping the growth and during changing the temperature without growth, so that As does not separate from the GaAs. In the present invention, however, TMAs is employed instead of AsH$_3$, diluted with hydrogen, during raising or decreasing the processing temperature when stopping growth after carbon-doping, and during cooling the substrate after completing stacking. As a result, free atomic hydrogen is not generated and, hence, does not diffuse into the C-doped layer reducing carrier concentration.

In addition, after forming the p$^+$-GaAs base layer 85 in step 7, n-AlGaAs emitter layer 86 is formed on p$^+$-GaAs base layer 85. Unless the substrate temperature at this time is raised from the optimum growth temperature of p$^+$-GaAs of about 590° C. to the optimum growth temperature of n-AlGaAs of about 700° C., the n-AlGaAs emitter layer 86 may not be efficiently formed. In accordance with an embodiment of the present invention, substrate temperature is changed, as a result of forming a different compound semiconductor layer after forming the C-doped p$^+$-GaAs base layer 85, under an atmosphere comprising TMAs diluted with hydrogen, thereby enabling changing the substrate temperature to a predetermined optimum growth temperature without generating atomic hydrogen. In this way, the present invention avoids the problem of the generation and diffusion of atomic hydrogen into the C-doped p$^+$-GaAs base layer 85 and, consequentially, prevents C—H coupling and, hence, C inactivation. Thus, the present invention enables formation of the n-AlGaAs emitter layer 86 at its optimum growth temperature. Moreover, the present invention significantly expands manufacturing flexibility in the selection of materials for forming a layer on the C-doped p$^+$-GaAs base layer 85.

Thus, in accordance with the present invention, the carrier concentration of the p$^+$-GaAs base layer 85 is not lowered, thereby avoiding deterioration of the p-n junction diode characteristics to provide a highly reliable HBT.

In addition, in accordance with the present invention, after forming n-AlGaAs emitter layer 86 on the C-doped p$^+$-GaAs base layer 85, the n$^+$-InGaAs emitter contact layer 87 is formed on n-AlGaAs emitter layer 86 at about 700° C. and the substrate is cooled under an atmosphere comprising TMAs diluted with hydrogen to about 300° C. and thereafter under an atmosphere in hydrogen to room temperature so that the substrate can be removed from the processing apparatus and delivered to the next processing step through the air. As a result of this cooling technique employing an atmosphere comprising TMAs diluted with hydrogen, there is no inactivation of C due to free atomic hydrogen generated from AsH$_3$ diffused in the C-doped p$^+$-GaAs base layer 85, as when cooled in a conventional manner under an atmosphere of AsH$_3$ diluted with hydrogen. Instead, under an atmosphere of TMAs diluted with hydrogen as employed in this example, there is no generation of free atomic hydrogen and, therefore, C-doped p$^+$-GaAs base layer 85 does not undergo a lowering of carrier concentration. Thus, the present invention enables a wafer to be cooled without lowering the carrier concentration of the C-doped p$^+$-GaAs base layer 85 after formation of the wafers, and the wafers may be withdrawn into the air at room temperature freely from a processing apparatus, thereby significantly enhancing flexibility in selecting manufacturing steps, thereby increasing the efficiency of formation and reliability of the resulting semiconductor device.

The C-doped compound semiconductor layer itself and the materials to be stacked on the C-doped compound semiconductor layer can be a material expressed as Al$_x$Ga$_{1-x}$As ($1 \geq x \geq 0$) or In$_y$Ga$_{1-y}$As ($1 \geq y \geq 0$). In addition, a variety of materials of superior electrical characteristic may be employed in the manufacturing process of an HBT.

Although the substrate temperature is changed in the growth stopping step under an atmosphere comprising TMAs diluted with hydrogen in the foregoing process, other alkylarsines diluted with hydrogen, such as triethylarsine, can be employed to realize the same advantage.

The Examples set forth below illustrate the advantages of the present invention.

EXAMPLE I

Figure 6:
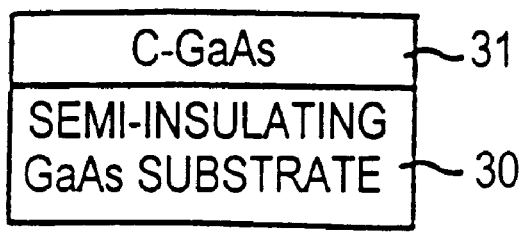
FIG. 6 is a sectional view of a sample produced in accordance with the present invention and tested.
Figure 7:
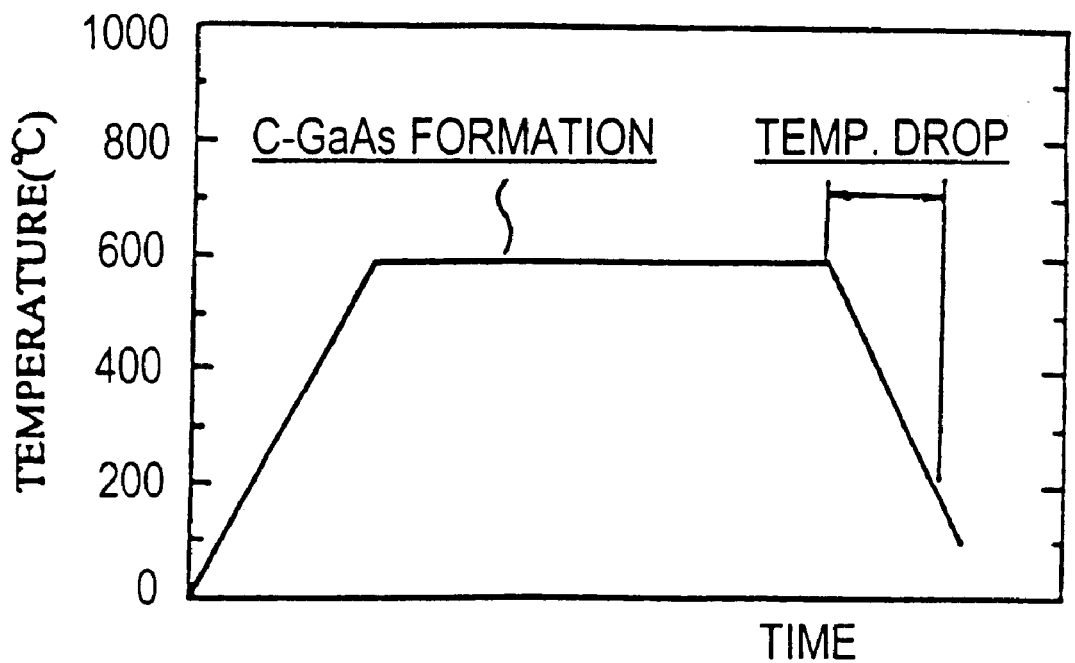
FIG. 7 is a graph showing the temperature employed in a method of the present invention to form a tested sample.

The sample depicted in FIG. 6 was employed in this Example I. In FIG. 6, reference numeral 30 designates a semi-insulating GaAs substrate, and numeral 31 designates a C-doped GaAs layer. FIG. 7 is a graph showing temperatures employed in manufacturing samples in accordance with the present invention subjected to testing in this Example I. Each sample was prepared by forming a single layer of C-doped GaAs layer 31 of about 3000 Å on semi-insulating GaAs substrate 30 by MOCVD under an atmosphere comprising TMAs and TMGa diluted with hydrogen. The Group-V/Group-III metal ratio was about 10 to 20; the growth pressure was about 100 Torr; the growth temperature was about 590° C., and the growth velocity was about 0.8 μm/h.

After growing C-doped GaAs layer 31, Sample 1 and Sample 2 were prepared under different atmospheres in cooling from the growth temperature of about 590° C. to about 300° C. Sample 1 was prepared by cooling from about 590° C. to about 300° C. under an atmosphere of AsH$_3$ diluted with hydrogen, after growing the C-doped GaAs layer 31. Sample 2 was prepared by cooling from about 590° C. to about 300° C. under an atmosphere of TMAs diluted with hydrogen, after growing the C-doped GaAs layer 31. Further, Sample 3 was prepared by cooling from about 590° C. to about 300° C. under an atmosphere of AsH$_3$, after growing the C-doped GaAs layer 31, so that carrier concentration after formation of the layer and before treatment thereof (i.e., layer in the grown state) is substantially equal to that of Sample 2. The carrier concentration of each Sample was obtained by the Van der Pauw method.

In order to determine the change in the carrier concentration of each sample under annealing conditions, Samples 1, 2 and 3 were annealed at about 450° C. for about 10 min. and further at about 500° C. for about 10 min. both under an atmosphere of nitrogen, and the carrier concentration evaluated by the Van der Pauw method.

Figure 8:
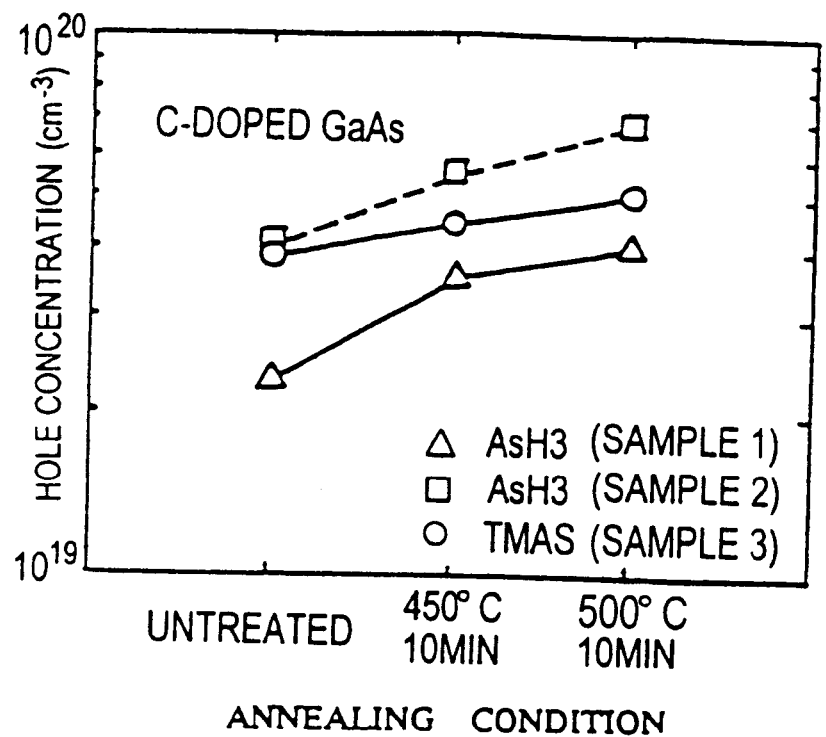
FIG. 8 is a graph showing the results of testing a sample produced in accordance with the present invention.

FIG. 8 is a graph showing the relationship between annealing temperature and carrier concentration of the C-doped GaAs layer 31 of the samples employed in this Example I. In FIG. 8, Δ designates a hole concentration of the Sample 1 under the annealing conditions, ○ designates that of the Sample 2, and □ designates that of the Sample 3. It is apparent from FIG. 8 that the hole concentration is influenced by the atmosphere during cooling. Samples 1 and 3, cooled under the atmosphere of $AsH_3$, experienced a pronounced increase in hole concentration (i.e., carrier concentration) with increased annealing temperature. On the other hand, Sample 2, cooled under the atmosphere of TMAs diluted with hydrogen, experienced a rather gentle increase in hole concentration with increased annealing temperature, vis-à-vis the dramatic increase in hole concentration experienced by Samples 1 and 3. It should be apparent from a comparison between the Samples 1 and 3, that the results do not depend on the hole concentration after formation of the layer and before treatment thereof. Further, in comparing the hole concentrations of Samples 1 and 2 after formation of the layer and before treatment thereof, in spite of the same growth conditions, the hole concentration of Sample 1 cooled under an atmosphere $AsH_3$ diluted with hydrogen was reduced to almost half that of Sample 2 cooled under an atmosphere of TMAs diluted with hydrogen. Even after annealing at about 500° C. for about 10 min., the hole concentration of Sample 1 is lower than that of Sample 2 by about 20%.

The exact mechanisms involved in the claimed invention cannot be stated with complete certainty. However, it is believed that the foregoing results of this Example I can be interpreted as set forth below.

(1) In Sample 1, cooled under the atmosphere of $AsH_3$ diluted with hydrogen, it is believed that free atomic hydrogen disassociated from $AsH_3$ during the cooling and diffused in the C-doped GaAs layer 31, thereby forming C—H coupling and inactivating C. (2) The increase in hole concentration by annealing under a nitrogen atmosphere is believed to occur due to discharge of hydrogen from the C-doped GaAs layer 31, thereby improving the activation rate of C.

(3) The variation in hole concentration by annealing under an atmosphere of nitrogen is believed to be dependent on hydrogen diffused into C-doped GaAs layer 31. In Sample 1 cooled under an atmosphere of $AsH_3$ diluted with hydrogen, it is believed that the amount of diffused hydrogen is not less than about $2 \times 10^{19}$ $cm^{-3}$.

On the other hand, in Sample 2 cooled under an atmosphere of TMAs diluted with hydrogen, there was less variation in hole concentration due to annealing, and the diffusion of hydrogen into the C-doped GaAs layer 31 was quite small, on the order of about $5 \times 10^{18}$ $cm^{-3}$. The same results were obtained by measuring the amount of diffused hydrogen by SIMS (Secondary Ion Mass Spectroscopy), and measuring C—H coupling by FTIR (Fourier Transform Infrared Spectroscopy).

As described above, in the steps of forming the C-doped GaAs layer 31 on the semi-insulating GaAs substrate 30 and cooling the substrate, cooling is performed under an atmosphere comprising TMAs diluted with hydrogen instead of cooling in a conventional manner under an atmosphere comprising $AsH_3$ diluted with hydrogen, thereby restraining diffusion of hydrogen into the C-doped GaAs layer 31 and improving the activation rate of carbon in the C-doped GaAs layer 31.

EXAMPLE II

Figure 9:
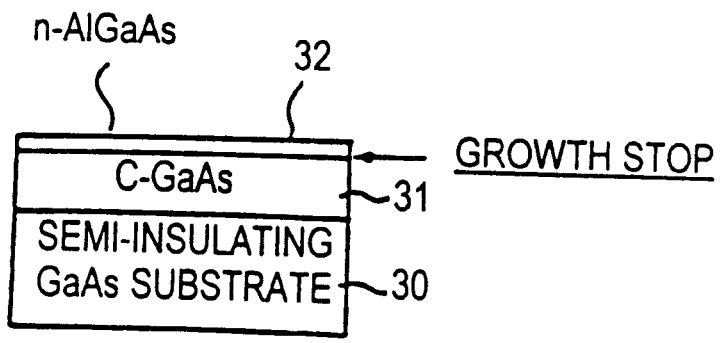
FIG. 9 is a sectional view of a sample produced in accordance with the present invention and tested.

FIG. 9 is a sectional view of a sample employed in this Example II of the present invention. In FIG. 9, reference numeral 30 designates a semi-insulating GaAs substrate, numeral 31 designates a C-doped GaAs layer, and numeral 32 denotes an n-$Al_{0.26}Ga_{0.74}As$ layer.

Figure 10:
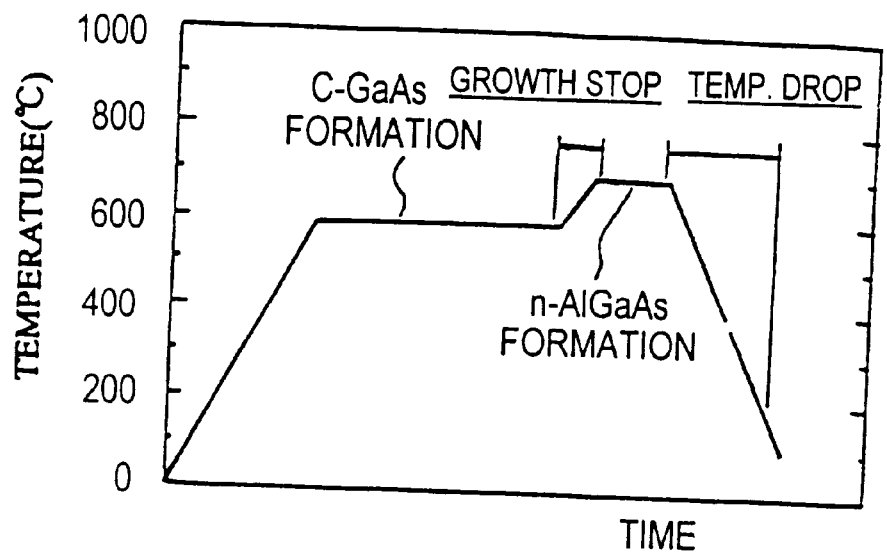
FIG. 10 is a graph showing the temperature employed in the inventive method to form a tested sample.

FIG. 10 is a graph showing the temperatures for manufacturing the Samples employed in this Example II. Each sample was prepared by forming a single layer of C-doped GaAs layer 31 of about 3000 Å on semi-insulating GaAs substrate 30 by MOCVD under an atmosphere comprising TMAs and TMGa diluted with hydrogen. The Group-V/GroupIII metal ratio was about 10 to 20; the growth pressure was about 100 Torr; the growth temperature was about 590° C.; and the growth velocity was about 0.8 $\mu$m/h.

After growing C-doped GaAs layer 31, growth was stopped for about 10 min, the substrate temperature was raised from about 590° C. to about 700° C., which is an optimum growth temperature for $Al_{0.26}Ga_{0.74}As$, and cooled to about room temperature after growing the n-$Al_{0.26}Ga_{0.74}As$ layer 32 at about 700° C.

Sample 4 and Sample 5 were prepared under different atmospheres in the growth stopping step after growing the C-doped GaAs layer 31. Sample 4 was prepared under an atmosphere of $AsH_3$ diluted with hydrogen during the growth stopping step. Sample 5 was prepared under an atmosphere of TMAs diluted with hydrogen during the growth stopping step.

After growing the n-$Al_{0.26}Ga_{0.74}As$ layer 32, Samples 4 and 5 were cooled to room temperature under an atmosphere of TMAs diluted with hydrogen. The carrier concentration of each Sample was determined by the Van der Pauw method.

Figure 11:
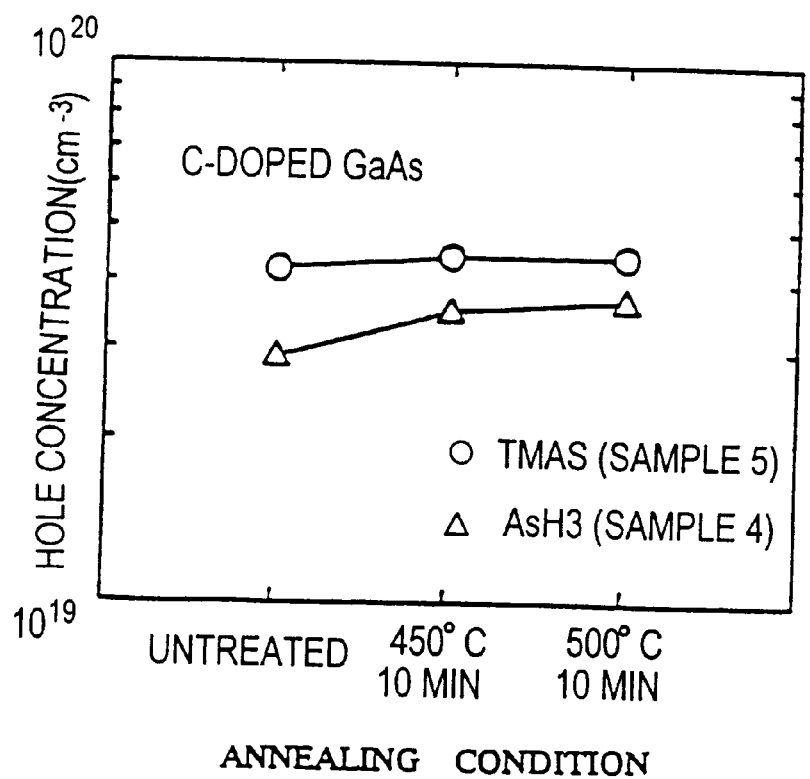
FIG. 11 is a graph depicting the results of testing sample as produced in accordance with the present invention.

In order to evaluate the effect of annealing conditions on carrier concentration, Sample 4 and Sample 5 were annealed at about 450° C. for about 10 min. and at about 500° C. for about 10 min., respectively, each under an atmosphere of nitrogen, and the carrier concentration determined by the Van der Pauw method. The graph depicted in FIG. 11 shows the relationship between annealing temperature and carrier concentration of the C-doped GaAs layer 31 of Sample 4 and Sample 5. In FIG. 11, Δ designates the hole concentration of Sample 4 under various annealing conditions, and ○ designates that of Sample 5.

In this Example II, since Sample 4 and Sample 5 were cooled to room temperature after growing the n-$Al_{0.26}Ga_{0.74}As$ layer 32 under an atmosphere comprising TMAs diluted with hydrogen, it is believed that the difference in hole concentration between Sample 4 and Sample 5 shown in FIG. 11 is due to the atmosphere in the growth stopping step. In Sample 5, growth stopping was performed under an atmosphere of TMAs diluted with hydrogen. Since Sample 5 experienced almost no variation in hole concentration due to annealing, it may be concluded that there was no hydrogen contamination of the C-doped GaAs layer 31 when the temperature was raised during the growth stopping step under an atmosphere comprising TMAs diluted with hydrogen. On the other hand, the growth stopping step of Sample 4 as performed under an atmosphere of $AsH_3$ diluted with hydrogen. Sample 4 experienced a variation in hole concentration during annealing, thereby supporting the conclusion that hole inactivation occurred due to hydrogen contamination of the C-doped GaAs layer 31 in the growth stopping step when raising the temperature.

Thus, Example II demonstrates that the inventive method comprising: forming the C-doped GaAs layer 31 on a semi-insulating GaAs substrate 30; stopping the growth for about 10 min.; and elevating the substrate temperature from about 590° C. to about 700° C., which is the optimum temperature for $Al_{0.26}Ga_{0.74}As$ layer 32, wherein growth stopping and temperature elevating are conducted under an atmosphere of TMAs diluted with hydrogen instead of under an atmosphere of $AsH_3$ diluted with hydrogen in accordance with conventional practices, dramatically reduces hydrogen contamination of the C-doped GaAs layer 31, thereby improving the activation rate of carbon in C-doped GaAs layer 31.

In Example I, as shown in FIG. 8, it was demonstrated that hydrogen contamination of C-doped GaAs layer 31 was prevented by cooling under an atmosphere of TMAs. In Example II, hydrogen contamination of C-doped GaAs layer 31 was prevented by stopping growth and elevating the temperature under an atmosphere of TMAs diluted with hydrogen. That is, after forming the C-doped $p^{30}$-GaAs base layer 85 (Step 7), when performing Steps 8 and 11 to change the temperature of the C-doped base $p^+$-GaAs layer 85 under an atmosphere of trimethylarsine diluted with hydrogen, hydrogen contamination of $p^+$-GaAs base layer 85 is dramatically reduced, thereby preventing a reduction in the activation rate of carbon. Further, as shown in Example I, $p^+$-GaAs base layer 85 was cooled under an atmosphere of trimethylarsine diluted with hydrogen. In other words, Step 11 (cooling the substrate) was performed after completing Step 7 (formation of the $p^+$-GaAs base layer), whereby hydrogen contamination of the C-doped compound semiconductor layer was dramatically reduced, thereby preventing a reduction of the carbon activation rate.

Further, in Example II, formation of C-doped GaAs layer 31 was ceased and the substrate temperature was elevated, for formation of the $Al_{0.26}Ga_{0.74}As$ layer 32, under an atmosphere of TMAs diluted with hydrogen. That is, after forming C-doped $p^+$-GaAs base layer 85 (Step 7), Step 8 (changing the temperature of the $p^+$-GaAs base layer 85 to an optimum growth temperature of the n-AlGaAs emitter layer 86 to be formed in the next step) was conducted under an atmosphere of trimethylarsine diluted with hydrogen, thereby enabling n-AlGaAs emitter layer 86 to be formed at the optimum growth temperature. As a result, n-AlGaAs emitter layer 86 is formed efficiently at an optimum growth temperature while preventing hydrogen contamination of the $p^+$-GaAs base layer 85.

According to the above-described manufacturing process of the present invention, in the steps of forming the C-doped p-type GaAs layer after forming the n-type GaAs layer, and stopping the growth to change the substrate temperature, the change of the substrate temperature is performed under an atmosphere of TMGa diluted with hydrogen, thereby preventing lowering of the C-doped carrier concentration. In addition, the steps of forming the p-type GaAs layer of higher concentration after forming the p-type GaAs layer of relatively low concentration, and stopping the growth to change the substrate temperature, the same advantage is realized by changing the substrate temperature under an atmosphere of TMAs diluted with hydrogen. In addition, although the step of stopping the growth to change the substrate temperature is performed under the atmosphere of TMAs diluted with hydrogen in the above-described manufacturing process, the same advantage is also exhibited when performing the growth stopping step under an atmosphere of other alkylarsine such as triethylarsine diluted with hydrogen.

EXAMPLE III

Figure 12:
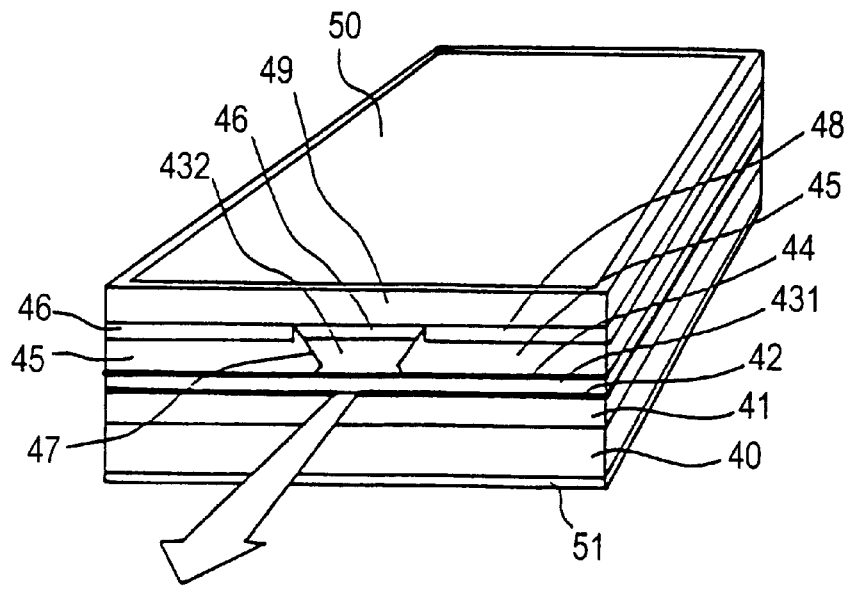
FIG. 12 is a sectional view of an LD produced in accordance with an embodiment of the present invention.

FIG. 12 is a sectional view of a compound semiconductor device produced in accordance with another embodiment of the present invention. In this Example III, a laser diode (hereinafter referred to as LD) of about 0.78 μm wave length having a multiple layer structure of AlGaAs is produced. In FIG. 12, reference numeral 40 designates an n-GaAs semiconductor substrate serving as a compound semiconductor substrate, numeral 41 designates a first clad layer of n-$Al_{0.48}Ga_{0.52}As$, and numeral 42 designates a MQW (Multiple Quantum Well) comprised of undoped $Al_xGa_{1-x}As$ ($1 \geq x \geq 0$) of plural composition ratios. In this Example III, the MQW is a TQW (Triple Quantum Well) active layer formed of three $Al_{0.1}Ga_{0.9}As$ layers stacked alternately on $Al_{0.35}Ga_{0.65}As$ layers. The active layer can also be a single layer of undoped $Al_xGa_{1-x}As$ ($1 \geq x \geq 0$). Furthermore, the active layer may be formed of either an MQW (Multiple Quantum Well) comprised of p-type $Al_xGa_{1-x}As$ ($1 \geq x \geq 0$) or a single layer of p-type $Al_xGa_{1-x}As$ ($1 \geq x \geq 0$). Numerals 431 and 432 designate a second clad layer comprising p-$Al_{0.48}Ga_{0.52}As$ serving as a compound semiconductor layer or a first compound semiconductor layer, numeral 44 designates an etch stop layer comprising p-type $Al_{0.65}Ga_{0.35}As$, numeral 45 designates a current blocking layer comprising n-GaAs, numeral 46 designates a cap layer comprising p-GaAs serving as a second compound semiconductor layer, numeral 47 denotes a light guided wave passage, numeral 48 designates a cap layer comprising p-GaAs, numeral 49 denotes a contact layer comprising p-GaAs, numeral 50 designates a positive (+) electrode, and numeral 51 designates a negative (−) electrode. The first clad layer 41, active layer 42, second clad layer 431, and etch stop layer 44 are sequentially disposed on a principal plane of semiconductor substrate 40.

The second clad layer 432 and cap layer 46 are formed by etching so as to be stripe-shaped on the center of etch stop layer 44. Light guided wave passage 47 is formed to be ridge-shaped by the second clad layer 432 and cap layer 46. Current blocking layer 45 is disposed on both sides of light guided wave passage 47 holding it therebetween. Cap layer 48 is formed on current blocking layer 45. Contact layer 49, a single layer, is commonly formed on cap layers 46 and 48. Positive electrode 50 is disposed directly on contact layer 49, and negative electrode 51 is disposed on another principal plane of semiconductor substrate 40.

Figure 13:
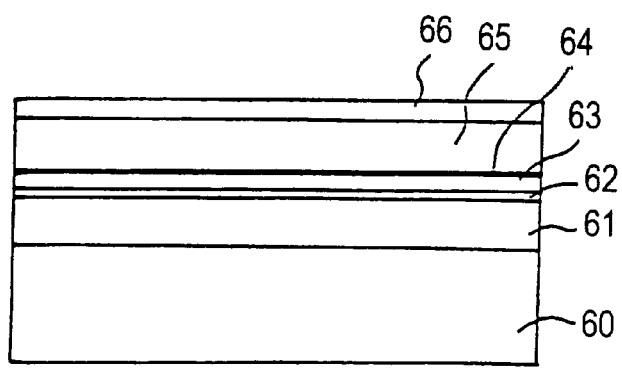
FIG. 13(a) is a sectional view of a device showing one stage of a method of manufacturing an LD in accordance with the present invention.
FIG. 13(b) is a sectional view of a device showing another stage of the inventive method of manufacturing an LD.
FIG. 13(c) is a sectional view of a device showing another stage of the inventive method of manufacturing an LD.
FIG. 13(d) is a sectional view of a device showing another stage of the inventive method of manufacturing an LD.
Figure 13:
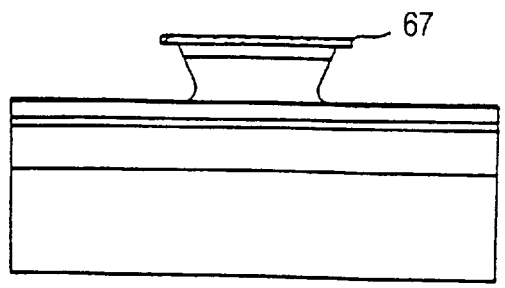
Figure 13:
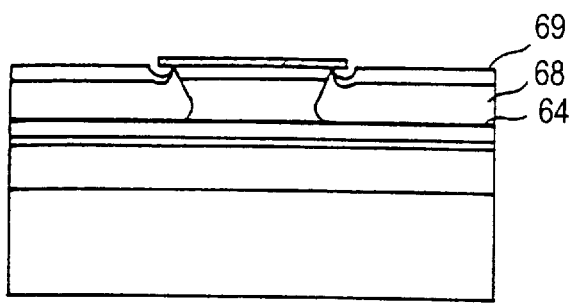
Figure 13:
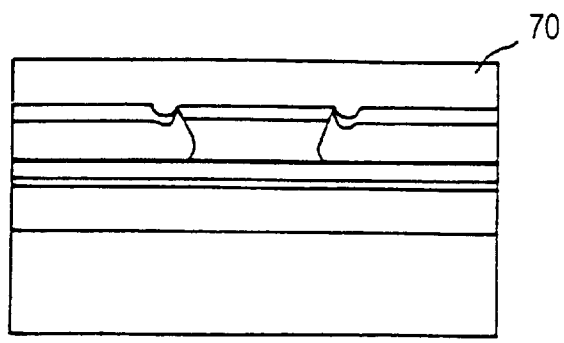

A method of manufacturing an LD in accordance with the invention is hereinafter described with respect to FIGS. 13(a), (b), (c) and (d) which depict sequential stages as hereinafter described.

(1) First Epitaxial Growth Step

The first epitaxial growth step is carried out by MOCVD. An n-$Al_{0.48}Ga_{0.52}As$ layer 61, serving as the first clad layer 41 is formed at a growth temperature of about 700° C., and an undoped layer 62, serving as the TQW active layer 42, is sequentially formed at a growth temperature of about 700° C. on n-GaAs substrate 60, serving as the semiconductor substrate 40. Growth is then stopped to change the substrate temperature from about 700° C. to about 650° C., which is an optimum growth temperature for the C-doped AlGaAs layer. A p-$Al_{0.48}Ga_{0.52}As$ layer 63, serving as the second clad layer 431, a p-$Al_{0.65}Ga_{0.35}As$ layer 64, serving as the etch stop layer 44, and p-$Al_{0.48}Ga_{0.52}As$ layer 65, serving as the second clad layer 432, are then sequentially formed under an atmosphere of TMGa, TMAl and TMAs diluted with hydrogen. Then, growth is stopped to decrease the substrate temperature from about 650° C. to about 590° C. under an atmosphere of TMAs diluted with hydrogen, and a C-doped p-GaAs layer 66, serving as the cap layer 46 of the light guided wave passage 47, is formed under an atmosphere of TMGa and TMAs diluted with hydrogen.

Thereafter, the wafer formed in the first epitaxial growth step is transferred in air to the next step. However, at the time of removing the wafer from the processing apparatus into the air, the wafer temperature was decreased under an atmosphere of TMAs diluted with hydrogen to prevent oxidation. All reductions in temperature are conducted under conditions to avoid oxidation The impurity concentration of the: n-GaAs substrate 60 is about $2\times10^{17}$ cm$^{-3}$; n-Al$_{0.48}$Ga$_{0.52}$As layer 61 is about $1\times10^{17}$ cm$^{-3}$; p-Al$_{0.48}$Ga$_{0.52}$layer 63, p-Al$_{0.65}$Ga$_{0.35}$As layer 64 and p-Al$_{0.48}$Ga$_{0.52}$As layer 65 are about $1\times10^{18}$ cm$^{-3}$; and p-GaAs layer 66 is about $10^{19}$ cm$^{-3}$. Among these layers, p-Al$_{0.48}$Ga$_{0.52}$As layer 63, p-Al$_{0.65}$Ga$_{0.35}$As layer 64, p-Al$_{0.48}$Ga$_{0.52}$As layer 65 and p-GaAs layer 66 are each C-doped layers. FIG. 13(a) is a sectional view of the device at the stage of the method wherein the first epitaxial growth step is completed.

(2) Light Guided Wave Passage Formation Step

An SiN film 67 is formed by a conventional method, such as plasma CVD, on the wafer formed in the foregoing first epitaxial growth step. Patterning is then performed by conventional photolithography leaving an SiN film 67 of about 8 μm in width to form a stripe-shape corresponding to the light guided wave passage. Employing stripe-shaped SiN film 67 as a mask, selective wet etching is performed leaving p-Al$_{0.65}$Ga$_{0.35}$As layer 64, serving as the etch stop layer 44, and light guided wave passage 47 as a ridge. FIG. 13(b) is a sectional view of the device at this stage of the method wherein the light guided wave passage forming step is completed.

(3) Second Epitaxial Growth Step

At this stage in the present method, n-GaAs layer 68, serving as the current blocking layer 45, is formed on p-Al$_{0.65}$Gas$_{0.35}$As layer 64 on both sides of light guided wave passage 47 under an atmosphere of TMGa, TMAl and TMAs diluted with hydrogen. A C-doped p-GaAs layer 69, serving as the cap layer 48, is formed under an atmosphere of TMGa and TMAs diluted with hydrogen on n-GaAs layer 68. After this second epitaxial growth step, the temperature is decreased under an atmosphere of TMAs diluted with hydrogen. FIG. 13(c) is a sectional view of the device at this stage of the method after completing this second epitaxial growth step. In addition, the p-GaAs layer 69 may be also doped with Zn in this step.

(4) Third Epitaxial Growth Step

The SiN film left on the cap layer is then removed by plasma etching, and a C-doped p-GaAs layer 70, serving as the contact layer 49, is formed by MOCVD on p-GaAs layer 66 and p-GaAs layer 69 under an atmosphere of TMGa and TMAs diluted with hydrogen. The temperature is decreased, after the third epitaxial growth step, under an atmosphere of TMAs diluted with hydrogen. FIG. 13(d) is sectional view of the device at this stage of the method after completing this third epitaxial growth step. In addition, the p-GaAs layer 70 may be also doped with Zn in this step. After the mentioned crystal growth step, an electrode formation step and a chip separation step are performed to obtain a complete LD chip.

In this Example III, since p-Al$_{0.48}$Ga$_{0.52}$As layer 63 and p-Al$_{0.65}$Ga$_{0.35}$As layer 64 are formed into C-doped p-type semiconductor layers, p-type impurities are restrained from diffusing into undoped layer 62, serving as the TQW active layer 42, resulting in an improvement in device reliability.

Since the growth stopping and subsequent drop of the substrate temperature from about 650° C. to about 590° C., after forming p-Al$_{0.48}$Ga$_{0.52}$As layer 63, p-Al$_{0.65}$Ga$_{0.35}$As layer 64 and p-Al$_{0.48}$Ga$_{0.52}$As layer 65, are performed under an atmosphere of TMAs diluted with hydrogen, the substrate temperature may be changed to an optimum growth temperature of the required material stacked on the p-type AlGaAs layers without diffusion of atomic hydrogen into the p-type AlGaAs layers, such as p-Al$_{0.48}$Ga$_{0.52}$As layer 63, p-Al$_{0.65}$Ga$_{0.35}$As layer 64 and p-Al$_{0.48}$Ga$_{0.52}$As layer 65.

The claimed invention, therefore, advantageously provides expanded flexibility in selecting the material formed on the p-type AlGaAs layer, thereby rendering it possible to efficiently manufacture a laser of a desirable material.

Furthermore, formation of C—H coupling in C-doped layers is prevented by cooling the wafer, after stacking C-doped p-GaAs layer 66 on p-Al$_{0.48}$Ga$_{0.52}$As layer 65, under an atmosphere of TMAs diluted with hydrogen. Accordingly, carbon is not inactivated and the C-doped p-type semiconductor layer does not undergo a lowering of carrier concentration, whereby the cooling of substrate and withdrawal of the wafer from processing equipment can be freely conducted. Since the substrate can be freely cooled and withdrawn from processing equipment, the wafer can be transported in air to a subsequent manufacturing apparatus, thereby increasing flexibility in selecting various manufacturing steps during production of a semiconductor device. In addition, a laser of high reliability without experiencing a reduction in the carrier concentration of a p-type semiconductor layer may be efficiently manufactured at a reasonable cost.

The C-doped compound semiconductor layer itself and the material to be stacked on the C-doped compound semiconductor layer may be composed of any material encompassed by the relationships Al$_x$Ga$_{1-x}$As ($1 \geq x \geq 0$) or In$_y$Ga$_{1-y}$As ($1 \geq y \geq 0$), and may be utilized in manufacturing a laser of superior light emitting characteristics employing a variety of materials.

Although the temperature change of the substrate in the growth stopping step is carried out under an atmosphere exemplified by TMAs diluted with hydrogen in the foregoing manufacturing process, similar advantages are achieved when performing the growth stopping step under an atmosphere of other alkylarsines, such as triethylarsine, diluted with hydrogen.

Only the preferred embodiment of the invention and but a few examples of its versatility are shown and described in the present disclosure. It is to be understood that the invention is capable of use in various other combinations and environments and is capable of changes or modifications within the scope of the inventive concept as expressed herein.

I claim:

1. A method of manufacturing a compound semiconductor device, which method comprises:

forming a first carbon-doped compound semiconductor layer of first conduction type on a compound semiconductor substrate at a first growth temperature;

changing the first growth temperature to a second growth temperature under an atmosphere comprising an alkylarsine without arsine;

stopping to supply the alkylarsine; and forming a second compound semiconductor layer on said first compound semiconductor layer at said second growth temperature under an atmosphere comprising arsine and a raw material gas for forming said second compound semiconductor layer.

2. The method according to claim 1, wherein said first and second compound semiconductor layers comprise either Al$_x$Ga$_{1-x}$As ($1 \geq x \geq 0$) or In$_y$Ga$_{1-y}$As ($1 \geq y \geq 0$).

3. The method according to claim 2, wherein said alkylarsine is either trimethylarsine or triethylarsine.

4. A method according to claim 1, after forming a second compound semiconductor layer further comprises:

cooling said first and second compound semiconductor layers to a temperature under an atmosphere comprising an alkylarsine without arsine.

5. The method according to claim 4, wherein said first and second compound semiconductor layers comprise either $Al_xGa_{1-x}As$ ($1 \geq x \geq 0$) or $In_yGa_{1-y}As$ ($1 \geq y \geq 0$).

6. The method according to claim 5, wherein said alkylarsine is either trimethylarsine or triethylarsine.

7. A method of manufacturing a compound semiconductor device, which method comprises:

forming a collector layer of n-type first compound semiconductor on a semi-insulating compound semiconductor substrates;

forming a base layer of p-type first compound semiconductor doped with carbon impurities at a first growth temperature;

changing said first growth temperature to a second growth temperature, after completing the formation of said base layer, under an atmosphere comprising an alkylarsine without arsine;

stopping to supply the alkylarsine; and forming an emitter layer of n-type second compound semiconductor on said base layer under an atmosphere comprising arsine and a raw material gas for forming said emitter layer.

8. The method according to claim 7, wherein said first and second compound semiconductor layers comprise either $Al_xGa_{1-x}As$ ($1 \geq x \geq 0$) or $In_yGa_{1-y}As$ ($11 \geq y \geq 0$).

9. The method according to claim 8, wherein said alkylarsine is either trimethylarsine or triethylarsine.

10. A method of manufacturing a compound semiconductor device, which method comprises:

forming a collector layer of n-type GaAs on a semi-insulating GaAs substrate;

forming a base layer of p-type GaAs doped with carbon impurities at a first growth temperature;

changing said first growth temperature to a second growth temperature, after completing the formation of said base layer, under an atmosphere comprising trimethylarsine without arsine;

stopping to supply the trimethylarsine;

forming an emitter layer of n-type $Al_xGa_{1-x}As$ ($1 \geq x \geq 0$) on said base layer under an atmosphere comprising arsine and a raw material gas for forming the emitter layer; and cooling each layer formed of compound semiconductor to a temperature under an atmosphere comprising trimethylarsine without arsine.

11. A method of manufacturing a compound semiconductor device, which method comprises:

forming a first clad layer of n-type compound semiconductor layer under an atmosphere comprising arsine and a raw material gas for forming the first clad layer, an active layer of compound semiconductor layer, and a second clad layer of p-type compound semiconductor layer doped with carbon impurities, at a first growth temperature on an n-type compound semiconductor substrate;

changing said first growth temperature to a second growth temperature under an atmosphere comprising an alkylarsine after completing the formation of said second clad layer;

forming a cap layer of p-type compound semiconductor layer on said second clad layer at said second growth temperature under an atmosphere comprising a raw material gas for forming the cap layer; and cooling each layer formed to a temperature under an atmosphere comprising an alkylarsine without arsine.

12. A method of manufacturing a compound semiconductor device, which method comprises:

forming a first clad layer of n-type $Al_xGa_{1-x}As$ ($1 \geq x \geq 0$) under an atmosphere comprising arsine and a raw material gas for forming the first clad layer, an active layer comprising either a single layer of $Al_xGa_{1-x}As$ ($1 \geq x \geq 0$) or plural $In_yGa_{1-y}As$ ($1 \geq y \geq 0$) layers, and a second clad layer of p-type $Al_zGa_{1-z}As$ ($1 \geq z \geq 0$) doped with carbon impurities, at a first growth temperature on an n-type GaAs substrate;

changing said first growth temperature to a second growth temperature under an atmosphere comprising trimethylarsine after completing the formation of said second clad layer;

forming a cap layer of p-type GaAs layer doped with carbon impurities on said second clad layer at said second growth temperature under an atmosphere comprising a raw material gas for forming the cap layer; and cooling each layer formed to a temperature under an atmosphere comprising trimethylarsine without arsine.

* * * * *